United States Patent Office 3,497,353

Patented Feb. 24, 1970

3,497,353

LIGHT-SENSITIVE POLYETHER REPRODUCTION LAYER

Hartmut Steppan, Wiesbaden-Dotzheim, Johannes Munder, Wiesbaden-Biebrich, Hans Ruckert, Wiesbaden-Schierstein, Günter Messward, Kelkheim, and Walter Lüders, Neu-isenburg, Germany, assignors to Kalle Aktiengesellschaft, Wiesbaden-Biebrich, Germany, a corporation of Germany No Drawing. Filed Jan. 4, 1967, Ser. No. 607,173

Claims priority, application Germany, Jan. 7, 1966, K 58,083

Int. Cl. G03c 5/00

U.S. Cl. 96—35.1 10 Claims

ABSTRACT OF THE DISCLOSURE

The present invention relates to a reproduction layer which comprises, as the light-sensitive component, novel polymers of the polyether type which undergo a reduction of their solubility or become insoluble by the action of light.

The preparation of light-sensitive vinyl polymers and the use thereof in reproduction layers is known. Thus, light-sensitive vinyl polymers have been prepared by incorporation of cinnamic acid groups or chalkone groups into the polymer molecules. The particular difficulties of this method reside in the fact that the free radical-initiated copolymerization of unsaturated cinnamic acid or chalkone derivatives leads to insoluble, i.e. cross-linked, copolymers. When using cinnamic acid vinyl esters, furthermore a cyclopolymerization occurs which leads to lactones. For these reasons, efforts have been made to first form the polymer main chain by polymerization initiated by free radicals and to provide the main chain with appropriate chalkone or cinnamic acid side chains by means of an esterifying reaction.

The present invention provides novel, negative-working light-sensitive reproduction layers for the production of photographic copies, tanned images, relief images, and printing plates having improved characteristics.

Further, the present invention relates to a light-sensitive reproduction layer which is suitable for the production of photographic copies, tanned images, relief images and printing plates, and which contains at least one copolymer prepared from at least one epoxide of each of the following types I and II:

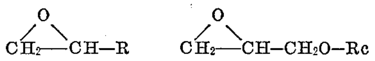

wherein:

R is hydrogen, alkyl, aryl, halogen alkyl, alkoxy methyl, allyloxy methyl, vinyloxy methyl or aryloxy methyl, and Rc is one of the groups;

$$-Rv-(CH{=}CH)_n-\underset{\displaystyle \overset{\|}{O}}{C}-Rw$$

$$-Rv-\underset{\displaystyle \overset{\|}{O}}{C}-(CH{=}CH)_n-Rx$$

$$-Rv-(CH{=}CH)_n-\underset{\displaystyle \overset{\|}{O}}{C}-(CH{=}CH)_m-Rw$$

$$-\underset{\displaystyle \overset{\|}{O}}{C}-CH{=}CH-Rv$$

$$-Rv-CH{=}CH-\underset{\displaystyle \overset{\|}{O}}{C}-Ry$$

in which

Rv and Rw each is a carbocyclic, aromatic group which is directly linked, via a carbon atom of its aromatic nucleus, to a vinylene group —CH=CH— or to the ketone group $$-\underset{\displaystyle \overset{\|}{O}}{C}-$$

Rx is a carbocyclic or heterocyclic, aromatic group which is directly linked, via a carbon atom of its aromatic nucleus, to one of the vinylene groups —CH=CH—, Ry is an alkyl ester group, an aryl ester group, a dialkylamide group or a heterocyclic amide group, and $n$ and $m$ each is a whole number from 1 to 4.

The aromatic groups Rv, Rw and Rx may be substituted by substituents such as alkyl, alkoxy or halogen. Two alkoxy groups also may be linked by ring closure, e.g. when the aromatic group is substituted by a methylene dioxy group.

The layer may contain known additives, such as dyestuffs, pigments, or sensitizers which are known to be suitable for increasing the light-sensitivity of chalkones and cinnamic acid derivatives.

The reproduction layers according to the invention consist of or contain, as the light-sensitive component, such polyethers which carry photo-active groups as side chains, viz. of the chalkone type or of the cinnamic acid type or vinylogous chalkone types. The structure of these photo-active polyethers is illustrated by the following summation formula:

$$HO-\left[CH_2-\underset{\displaystyle R}{\underset{|}{C}H}-O\right]_p-\left[CH_2-\underset{\displaystyle \underset{\displaystyle \underset{\displaystyle Rc}{|}}{\underset{|}{O}}}{\underset{|}{\underset{\displaystyle CH_2}{\underset{|}{C}H}}}-O\right]_q-H$$

wherein:

R is hydrogen, or alkyl, preferably methyl or ethyl; or aryl, preferably phenyl, methyl phenyl, halogen phenyl with fluorine, chlorine, bromine or iodine as the halogen group; or halogen alkyl, e.g. $—CH_2Cl$, $—CH_2CH_2Cl$, $—CH_2F$, $—CH_2CH_2F$, $—CHCl_2$, $—CHF_2$, $—CCl_3$, $—CH_2CCl_3$, $—CF_3$, $—CH_2CF_3$, $—CHClCH_2Cl$, $—CHFCH_2F$; alkoxy methyl with 1 to 5 carbon atoms in the alkoxy group; allyloxy methyl; vinyloxy methyl; or aryloxy methyl, preferably phenyloxy methyl or alkylphenyloxy methyl with 1 to 5 carbon atoms in the alkyl group;

Rc is a group having a chalkone or cinnamic acid group, and $p$ and $q$ are whole numbers.

The light-sensitive component II should be incorporated in the copolymer in a quantity of at least 0.01 mole percent, preferably more than 0.1 mole percent.

Of particular interest for the purposes of the invention are copolymers which contain 0.1 to 10 mole percent of the photo-active component II, based on the molar sum of the components of the copolymer. In principle, the amount incorporated may be even larger but, for economic reasons, a larger quantity of photo-active component II will not normally be employed, because the advantages obtained will not be sufficient to justify the incorporation of a larger amount.

The polymers used in the invention as components of reproduction layers comprise copolymers with monomeric units arranged in an irregular distribution according to statistical probability and such copolymers which, in the arrangement of their monomeric units and in their steric structure, resemble any of the mixed types of copolymers, e.g. block copolymers in which the monomeric units are arranged in a head-to-tail order.

The reproduction layer according to the invention may be used with great advantage in many fields. One technical advantage is the fact that the photo-active polyethers of the invention can be more easily prepared than the known photo-active polymers which carry chalkone or cinnamic acid side chains. Another advantage is the fact that the polymer solutions obtained by the polymerization process can be directly used for coating. Even small quantities of light of the wavelength range of about 2000 to 7000 A. change the novel reproduction layer to such an extent that, after image-wise exposure, copies of the original may be prepared within a short time by a suitable developing process and the application of pigmented substances.

Reproduction layers which contain, a photo-active polymers, copolymers of ethylene oxide with photo-active oxiranes of Formula II, are of particular interest. Numerous polymers of this type, e.g. those synthesized from 95 percent by weight, and more, of ethylene oxide units, are soluble in water as well as in anhydrous organic solvents, e.g. in aromatic substances, such as benzene or toluene. Reproduction layers prepared from such copolymers can be developed particularly well and easily with water or aqueous solutions. However, copolymers with a lower content of ethylene oxide, down to about 50 percent by weight, based on the weight of the copolymer, also may be developed with water or aqueous solutions. The solutions of the photo-active polymers in hydrocarbons have the advantage that they can be applied to a layer which is insoluble in these hydrocarbons without dissolving this coating. This possibility also is provided by the photo-active polymers of this invention which are insoluble in water. other customary solvents, e.g. alcohol or dioxane, which are normally used together with known photo-active polymers, are much less suitable for application to a previously applied coating. For coating, solutions containing organic solvents only often are preferred since they form more uniform layers on the support upon drying than do partially or completely aqueous solutions.

The copolymers of the invention have the further advantage that even when only small amounts of photo-active monomers, e.g. from 1 to 10 percent by weight (which, in the case of copolymers of ethylene oxide, corresponds to about 0.2 to 2 mole percent) are incorporated, reproduction layers are obtained which are so light-sensitive that, when the pigment process is employed, copies of an original may be produced within 1 to 5 seconds by the action of sunlight and within 2 minutes by the action of a 60 watt incandescent lamp at a distance of 10 cm. This means that only very small amounts of the expensive photo-active component must be incorporated in the copolymer.

In contradistinction to known pigment processes, e.g. the so-called anthracotype process, which are positive working dusting processes using reproduction layers having a smooth surface, the process performed with the reproduction layer of the invention is negative-working.

In the preparation of offset printing plates, it is an advantage of the reproduction layer of the invention that it permits a particularly simple performance of the so-called reversal process, without decoating, i.e. without removal of the light-hardened reproduction layer before printing, because the layer is hydrophilic.

If the process of the invention is used for decorating ceramics, it should be noted that, contrary to known processes, decorating may be performed by a negative-working pigment process.

Since the novel reproduction layer of the invention may be either disposed on any desired support, such as metal (e.g. single metal or multi-metal plates), paper, plastic, glass, ceramics etc., or may be used in the form of a self-supporting film, it is suitable for many purposes, e.g. the preparation of printing plates, in particular for planographic and offset printing, and also for screen printing. Further, the novel reproduction material may be used for the preparation of so-called printed circuits (etched resists) and of printing plates for use in relief and intaglio printing.

The reproduction layer according to the invention also may be used for the preparation of originals for transfer printing.

An important field of application for the reproduction layers of the invention is the preparation of single copies on various supporting materials, either by the contact process or by projection, e.g. by reenlargement from microfilms. Further, the reproduction layer of the invention may be used for applying image patterns or text, e.g. to machine housings, glass or ceramics, which then may be burned in after a suitable pigment or enamel color has been applied. Alternatively, colors, pigments, or phosphores may be incorporated in the reproduction layer. In this case, the areas of the layer not struck by light during exposure may be washed away so that colored images are obtained, which then may be burned in, if desired (tanned and relief images, if desired Braille).

On transparent supporting material, colored copies also may be prepared from color separation negatives, which may be superimposed and combined to form a colored image.

The reproduction layer of the invention may be combined with known reproduction layers. Thus, the photo-active polyethers may be incorporated in diazotype layers or in photopolymer reproduction layers, especially those which, in addition, contain polyethers which are not photo-active, e.g. polyethylene oxide.

The photo-active polymers to be used as reproduction coating materials in accordance with the present invention are prepared by copolymerization of epoxides of the following general formulae:

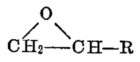

I and

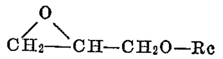

II in the presence of ionic catalysts which, under the polymerization conditions prevailing, cause opening of the oxirane rings.

The following compounds are used, e.g. as component II in the preparation of the copolymers use in the reproduction material of the present invention:

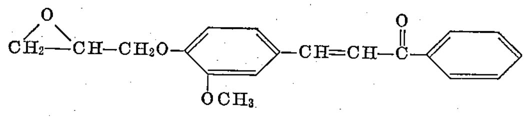

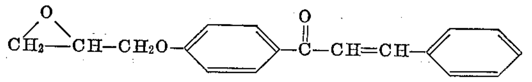

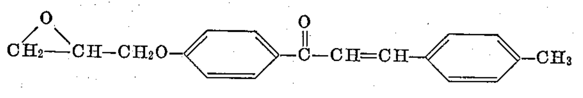

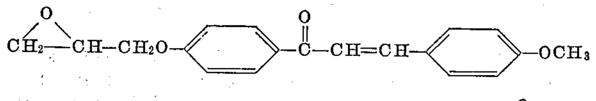

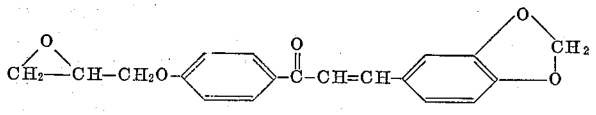

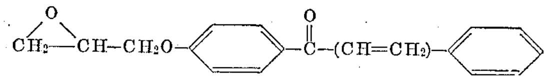

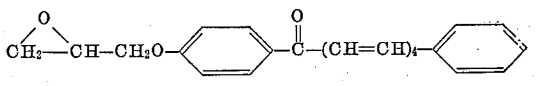

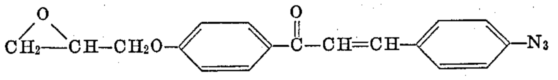

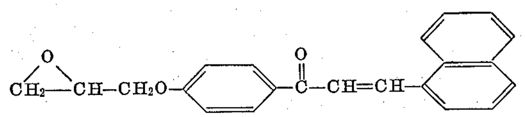

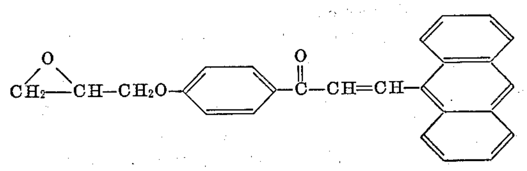

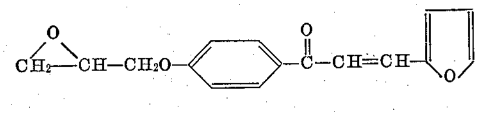

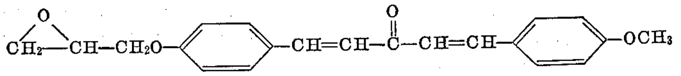

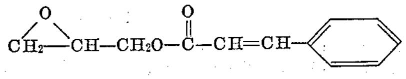

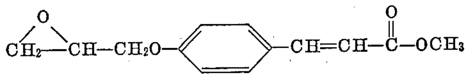

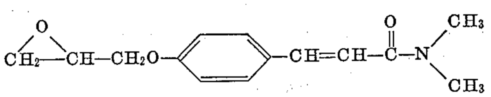

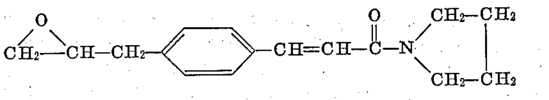

The following compounds preferably are used as components I: ethylene oxide, propylene oxide, 1,2-butylene oxide, styrene oxide, epichlorohydrin, epibromohydrin, vinylglycidylether, allylglycidyl ether, phenylglycidylether, in particular ethylene oxide and propylene oxide, epichlorohydrin and phenylglycidyl ether.

For polymerization, ionic catalysts are suitable which, under the conditions of the polymerization process, cause a ring opening of oxirane rings. Alkali hydroxides and alkaline earth hydroxides may be used, e.g., as catalysts, also calcium amide, zinc carbonate, iron(III)-chloride, iron(III)-alkoxides, iron(III)-salts, $SbCl_5$, $SnCl_4$, $BF_3$, and $BF_3$-etherate. The preferred catalysts are organic compounds of the metals aluminum, zinc, and magnesium corresponding to the general formula:

$$MeR'R''_{x-1}$$

wherein:

Me is a metal of the valence $x$,
R' is alkyl, preferably methyl or ethyl, and
R'' is H, alkyl, preferably methyl or ethyl, alkoxy, preferably methoxy or ethoxy, or hydroxyl.

The catalysts are prepared in known manner from metal alkyls to which exactly defined small quantities of water and complex formers are added.

Copolymerization is effected at temperatures ranging from 20 to 100° C., preferably from 30 to 80° C.

Suitable solvents for performing the polymerization process are, e.g. aliphatic and aromatic hydrocarbons, preferably aliphatic hydrocarbons with boiling points between 50 and 150° C., benzene, toluene, chlorinated hydrocarbons, preferably carbon tetrachloride and, if desired, ether.

It has been found to be advantageous to exclude the action of daylight and normal room light during the polymerization reaction and the ensuing processing of the polymer products. The cross-linking process proceeds considerably slower in solution than in the solid substance.

Advantageously, copolymerization should be effected with the exclusion of oxygen, e.g. in a nitrogen atmosphere. It is absolutely necessary to prevent the access of moisture insofar as possible.

Preferably, polymers are used in the reproduction layer of the invention which are solid at room temperature. However, polymers which are pasty or liquid at room temperature also may be applied.

The solubility characteristics of the copolymers vary within wide limits, depending upon the substituents R and Rc. For instance, the copolymers of ethylene oxide (R is hydrogen) are at least partially soluble or dispersible in water, as the case may be, even with relatively high contents of component II. By selecting different components I, e.g. propylene oxide or epichlorohydrin (R is methyl or $-CH_2Cl$), copolymers are obtained which are insoluble in water. By an additional incorporation of ethylene oxide, however, copolymers may be again obtained which are at least partially soluble or dispersible in water.

Preferably, not more than 70 percent by weight of components I, wherein R is aryl, halogen methyl or aryloxymethyl, and less than 20 percent by weight of components I wherein R is allyloxymethyl, should be incorporated in the polymer, since the incorporation of larger quantities may result in an undesirably low solubility of the (unexposed) polymer, as a result of which processing is impeded.

By exposing the polymers to light of a wavelength between 2000 and 7000 A., their solubility in solvents which dissolve the unexposed polymers, is reduced or destroyed. Suitable light sources are those the emitted radiation of which contains a high proportion of ultra-violet light, e.g. in the range from 3000 to 4000 A. However, light sources emitting only a very small proportion of actinic light, e.g. the incandescent lamps normally used for room illumination, also may be used. Further, all types of lamps customarily used in reproduction processes may be used as light sources, e.g. carbon arc lamps, xenon lamps, mercury vapor lamps, and actinic and superactinic luminous substance lamps. Sunlight also is suitable.

Image-wise exposure of the reproduction layer of the invention may be effected with varying exposure times and in different ways, depending on the combination of substances present, the supporting material used, and the desired result. The feasible possibilities range from a contact exposure in a vacuum frame with a plastic or glass cover to exposure by means of a projector or in a camera, if desired with simultaneous enlargement or reduction of scale; the exposure time may range from a fraction of a second to several hours.

Depending upon the composition of the photo-active copolymers, copolymers and light-decomposition products thereof are obtained which possess a variety of gradated physical properties. For instance, copolymers which contain as component I chiefly compounds in which R is not hydrogen, are difficulty soluble or insoluble in water and are oleophilic, i.e. they accept the usual greasy printing inks. If the copolymers contain, as component I, only or preponderantly ethylene oxide, light-decomposition products are obtained which are more or less hydrophilic, i.e. they accept greasy ink less readily or not at all.

Copolymers which contain, as component I, more than 50 percent by weight of ethylene oxide are a particularly valuable group of compounds for use in the present invention, since they permit development of the image-wise exposed reproduction layer with water or with solvents having a high water content.

Copolymers with a high percentage of ethylene oxide, which yield hydrophilic light-decomposition products, permit a particularly simple and thus technically advantageous execution of the so-called reversal process for the preparation of offset plates, because the light-hardened reproduction layer need not be removed before printing.

For the preparation of the reproduction material, the reproduction layers according to the invention are applied to the support in known manner, e.g. by coating, whirl-coating, swabbing, dip-coating, or roller application, or by laminating the reproduction layer in the form of a self-supporting film to a support, and the layers then are dried with a current of warm air. Especially when thicker layers are to be applied, it may be advisable to pre-coat the support with an antihalation coating. The usual additives, such as dyestuffs, sensitiziers known to be suitable for chalkone and cinnamic acid derivatives, pigments, wetting agents, plasticizers, anti-oxidants and stabilizers against thermal decomposition, as well as organic and inorganic fillers, may be incorporated in the reproduction layer. Suitable organic fillers are, e.g., photo-inactive polyethers, e.g. homopolymers or copolymers of different epoxides of the above defined type I, or other polymers which are compatible with the photo-active polymers, e.g. those of the vinyl polymer series. Suitable inorganic fillers are, e.g., glass powder, silicon dioxide in extremely fine distribution, or clay. Advantageously, these additives should be selected in such a manner, however, that they diminish as little as possible the optical transparency of the reproduction layer in the main range of adsorption of the light-sensitive copolymers.

Depending upon the type of light-sensitive polymer used, development of the image-wise exposed reproduction materials may be effected with water or organic solvents, e.g. lower aliphatic alcohols, such as methanol or ethanol, carboxylic acid esters, such as methyl acetate or ethyl acetate, aliphatic ketones, such as methylethyl ketone or acetone, aromatic hydrocarbons, such as benzene or toluene, or ethers, such as dioxane and tetrahydrofuran, or with mixtures of such organic solvents with one another or with water.

If they do not already contain dyestuffs, the exposed areas of the layer may be subsequently dyed, e.g. with aqueous dyestuff solutions, with solutions of dyestuffs in organic solvents, or with greasy printing ink, depending upon the characteristics of the particular layer, in order to improve the visibility of the image obtained.

In a preferred modification of the method for dyeing the image, which is particularly suitable for water-developable reproduction layers and the preparation of single copies, the dry layer is dyed, after exposure, with a very finely pulverized organic or inorganic pigment and then developed by spraying with water. During the spraying process, the pigment is removed much earlier from the areas not struck by light than from the light-struck areas. By this process, sharp copies which are fast to light may be produced with short exposure times and in any desired color.

Particularly in the case of the above-described pigment process, and also when other processing methods are employed, the following should be noted: It is possible, but not advisable to use a supporting material with an extremely smooth surface. Advantageously, the support should be superficially roughened by mechanical or chemical methods, because this improves the adhesion of the reproduction layer. A surface which is particularly suitable is e.g. electrolytically roughened aluminum foil. Since the functioning of the reproduction layers of the invention can be demonstrated on this type of support without problems of lack of adhesion, this support preferably is used in the following examples.

Especially when the pigment process is to be performed, a reproduction layer of such thickness must be applied that all protruding grain peaks of the support are completely covered by the reproduction layer. Otherwise, the pigment would be held by the uncovered grain tops from which it could be removed only with difficulty or not at all in the ensuing washing process. The smoother the surface, the thinner the reproduction layer which can be applied, which is of advantage because of the shorter exposure times applicable. An unduly extended exposure time may reduce the receptivity of the light-struck areas for the pigment and their adhesiveness thereto. During development with a water spray, a low water pressure preferably is employed. In the case of unfamiliar layers, the developing characteristics of which are unknown, development is begun at a very low water pressure, which then is increased until development proceeds with satisfactory speed and safety. As a by-result of this process, the pigment adhering to the light-struck areas is covered with a solution of the unexposed reproduction layer in water. As a consequence, a pigment copy is obtained upon drying which is relatively fast to marring. The fastness to marring and wiping may be further increased by subjecting the copy to a short after-exposure.

The invention is further illustrated by the following examples. The quantities are stated as parts by weight and percentages are by weight. The temperature references are to degrees centigrade.

In the following, a number of dyestuffs and pigments used in the examples are defined:

Victoria Blue B—Color Index No. 44045,
Heliogen Blue B—Color Index No. 74160,
Paratoner B—Schultz' Farbstofftabellen, 7th edition, vol. I, 1931, No. 60,
Carbon Black FW 2 (for paints)—Medium particle size 118 A., marketed by Degussa, Frankfurt,
Fatty Red HRR—A dyestuff of the formula $C_{22}H_{16}N_4O$, which is prepared by coupling diazotized 4-amino-azo-benzene with β-naphthol.

EXAMPLE 1

An electrolytically roughened aluminum foil is coated on a plate whirler with a 2 percent benzene solution of a copolymer prepared from 7.5 parts by weight of propylene oxide, 2 parts by weight of ethylene oxide, and 0.5 part by weight of the glycidoxychalkone of the following formula

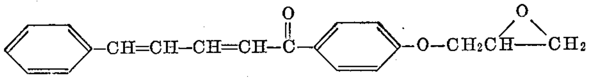

The foil is exposed for 10 seconds under a negative line original, using a 40 amp. arc lamp at a distance of 1 m. and a conventional vacuum printing frame.

After development with ethyl acetate, the foil is dyed with a solution of Victoria Blue B in ethanol, sprayed with water, and dried. A positive blue image is thus obtained which, after moistening with ethanol, may be used for making prints on paper and is thus suitable for transfer printing.

The copolymer is prepared as follows: 100 parts by weight of benzene, 7.5 parts by weight of propylene oxide, 2 parts by weight of ethylene oxide, 0.5 part by weight of cinnamal acetophenone glycidylether-(4), and 4.5 parts by weight of a catalyst solution made up of 4.12 parts by weight of aluminum triethyl dissolved in a mixture of 11.23 parts by weight of n-heptane and 6.94 parts by weight of diethylether, 0.31 part by weight of water, and 1.76 parts by weight of acetyl acetone are filled, under a nitrogen atmosphere, into a polymerization vessel protected against light and agitated for 4 hours at 70° C. The polymerization process then is interrupted by adding 2 parts by weight of anhydrous ethanol. After evaporation of the solvent by steam distillation, a rubber-like solid substance is obtained which is dried for 16 hours at 50° C. under reduced pressure.

EXAMPLE 2

An electrolytically roughened aluminum foil is coated with a 1 percent benzene solution of a copolymer prepared, in the manner described in Example 1, from 9.8 parts by weight of ethylene oxide and 0.2 part by weight of a glycidoxy chalkone of the following formula

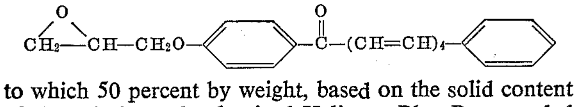

to which 50 percent by weight, based on the solid content of the solution, of pulverized Heliogen Blue B suspended in ethanol have been added.

Drying is effected first with a current of warm air, then for 2 minutes at 100° C. The material is exposed for 1 to 2 minutes under a negative original in an illuminating device equipped with 13 Philips fluorescent tubes of the type TL–AK40W/05 mounted in a plane of 60 x 60 cm. The distance from the lamp is 7 cm.; the cover is a polyvinyl chloride film.

The foil is thoroughly wetted with water and then developed by wiping lightly with ethanol. If necessary, wetting with water may be repeated.

A blue-colored tanned image of the original is obtained.

EXAMPLE 3

An electrolytically roughened aluminum support is coated on a plate whirler with a 1.1 percent solution, in a mixture of 1 part by weight of toluene and 7 parts by weight of dioxane, of a copolymer prepared by the method described in Example 1 from 19.5 parts by weight of ethylene oxide and 0.5 part by weight of a glycidoxychalkone of the following formula:

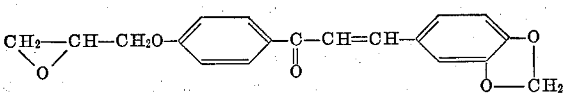

Drying is effected first with a current of warm air, then for 2 minutes at 100° C.

The foil is exposed for 10 minutes under the conditions stated in Example 2. After removing the areas of the layer not struck by light, by spraying with water, the foil is dried. Then, it is treated with an etching solution, rinsed again with water, dried, and then lacquered with a deep etching lacquer, e.g. a lacquer of the following composition:

| | Parts by wt. |
|---|---|
| Chlorinated rubber of a viscosity of 35–55 cp. | 5.8 |
| Chlorinated rubber of a viscosity of 80–105 cp. | 5.8 |
| Resin acid-midified phenol resin | 5.0 |
| Xylene | 67.0 |
| Mesitylene | 17.0 |
| Fatty Red HRR | 0.4 |

After drying, the lacquer film adhering to the exposed reproduction layer is removed by wiping with a 1.5 percent aqueous phosphoric acid solution. After being inked with greasy ink, the plate may be used directly as a positive offset printing plate, without prior removal of the hardened reproduction layer from the non-image areas.

The following etching solution is used:

| | Parts by wt. |
|---|---|
| $CaCl_2 \cdot 2H_2O$ | 41 |
| $H_2O$ | 44 |
| $ZnCl_2$ (desiccated) | 5.6 |
| $FeCl_3 \cdot 6H_2O$ | 2.8 |
| HCl (35%) | 0.5 |
| Ethanol | 6.0 |

EXAMPLE 4

An electrolytically roughened aluminum foil is coated on a plate whirler with a 1.3 percent solution, in a 1:3 mixture of toluene and dioxane, of a copolymer prepared as described in Example 1 from 12.5 parts by weight of propylene oxide, 7.0 parts by weight of phenylglycidylether, and 0.5 part by weight of a chalkone of the following formula:

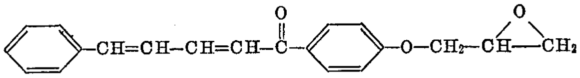

The applied coating is dried first in a current of warm air and then for 2 minutes at 100° C.

The foil then is exposed for 2 minutes under a negative original, employing the light source used in Example 2 and the conditions stated therein. Development is effected by immersion of the foil in ethyl acetate, with simultaneous light wiping with a cotton pad. After rinsing with fresh ethyl acetate, the foil is dried. The plate now is treated with a 1.5 percent aqueous solution of phosphoric acid, with 0.5 percent of sodium fluoride added, rinsed with water, and inked up with greasy ink. If necessary, the plate may be cleaned again with dilute phosphoric acid. A positive offset plate is thus obtained from which a large number of prints can be made.

EXAMPLE 5

An electrolytically roughened aluminum foil is coated on a plate whirler with a 0.7 percent solution, in a 9:1 mixture of benzene and toluene, of a copolymer, prepared as described in Example 1, from 18 parts by weight of ethylene oxide and 2 parts by weight of a chalkone of the following formula:

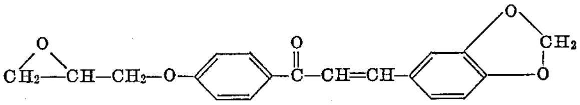

to which 30 percent, based on the copolymer content of the solution, of a commercially available polyethylene oxide have been added which, according to the manufacturer's statements, has an average molecular weight of 600,000. The foil is dried for 2 minutes at 100° C. and then exposed for 2 to 4 minutes under a negative original, using a 60 watt tungsten incandescent lamp at a distance of 10 cm. Alternatively, exposure may be effected in a commercial photoprinting device for processing diazotype papers. For instance, passage of the foil, at the highest adjustable speed, through an automatic photoprinter marketed by Kalle A.G., Wiesbaden-Biebrich, under the designation "Ozafix" is sufficient. At this setting, the foil is exposed for 6 seconds in this device.

The image may be made visible by one of the following methods:

(a) After exposure, the entire layer is dyed with a pigment, e.g. Paratoner B, and then treated with a water spray until the pigment is removed from the parts of the layer not struck by light, while it adheres to the areas struck by light. A positive red copy on a clean background is obtained.

(b) Development is effected with a water spray, the foil is dried, and then moistened with a dyestuff solution, e.g. a 1 to 2 percent solution of Victoria Blue B in ethanol, again rinsed with water, and dried. A blue-colored, positive copy of the original is thus obtained.

EXAMPLE 6

An electrolytically roughened aluminum foil is coated with a 0.75 percent solution, in a 1:1:4 mixture of toluene, dioxane and benzene, of a copolymer prepared as described in Example 1 from 19 parts by weight of ethylene oxide and 1 part by weight of a chalkone of the following formula:

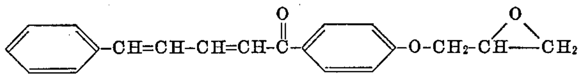

The foil is exposed for 2 to 5 seconds to sunlight and colored, positive copies of the original are then obtained by the methods described in Example 5 sub (a) and (b). When Carbon Black FW2 is used and method sub (a) is followed, strongly black-colored copies are obtained.

EXAMPLE 7

This example demonstrates the possibility for an additional sensitization of the reproduction layer:

An electrolytically roughened aluminum foil is coated with a 0.8 percent solution, in a 1:1 mixture of toluene and dioxane, of a copolymer, prepared as described in Example 1, from 19.5 parts by weight of ethylene oxide and 0.5 part by weight of cinnamic acid glycidylester. The weight of the layer is 23 mg./100 $cm.^2$. A sample of the foil thus prepared is marked "Sample A."

2.5 percent, based on the copolymer content of the solution, of Michler's ketone then are added to the solution, and a similar support to the one used above is coated under identical conditions: a material of a layer weight of 20 mg./100 $cm.^2$ is obtained which is marked "Sample B."

Strips of Sample A and Sample B then are subjected, side by side, to a step-wise exposure, using the light source described in Example 2 at the other conditions stated therein. The exposure times are 10 seconds, 30 seconds, 1 minute, 5 minutes and 10 minutes. Then, the samples are developed by the methods stated in Example 5 sub (a) and (b).

Whereas only a very weak image is produced in Sample A, even after an image-wise exposure of 10 minutes, Sample B shows a good image after as short an exposure time as 30 seconds, when the light source used in Example 2 and the other conditions stated therein are employed.

An equally substantial increase in the light-sensitivity was obtained when a copolymer prepared from 19 parts by weight of ethylene oxide and 1 part by weight of 4-glycidoxycinnamic acid methylester was sensitized in an analogous manner.

EXAMPLE 8

Plates of unglazed clay or porcelain or glass (the glass plates being roughened e.g. by etching with hydrofluoric acid) are coated with a 1 percent benzene solution of a copolymer prepared from 19 parts by weight of ethylene oxide and 1 part by weight of a glycidoxychalkone of the following formula

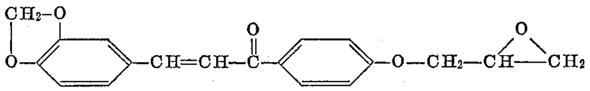

Only one layer is applied to the glass plate, whereas the more porous supports are given a second coating after the first coating has been dried at 100° C.

The material is exposed for 15 seconds under a negative original using a 40 amp. carbon arc lamp at a distance of 1 m. Then, the entire layer surface is dyed with an inorganic pigment, e.g. red ferric oxide or a very finely pulverized enamel color. By subsequent cautious treatment with a water spray, the pigment is removed from the areas of the layer which were not struck by light. A positive pigment image is thus obtained which may be burned in.

The light-sensitive copolymer employed in the present example was prepared in accordance with the procedure of Example 1.

EXAMPLE 9

A brushed aluminum foil is coated with a 1 percent benzene solution of a copolymer prepared from 9.5 parts by weight of ethylene oxide and 0.57 part by weight of a glycidoxychalkone (88%) having the following formula:

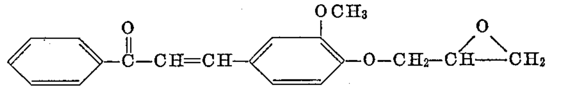

The foil is exposed for 2 to 5 seconds under a negative original to the light of a 40 amp. carbon arc lamp at a distance of 1 m. The entire layer is then dyed with Carbon Black FW2 and developed with a water spray to yield a black, positive copy.

EXAMPLE 10

A sheet of baryta paper is coated with a 1 percent benzene solution of the photo-active copolymer used in Example 9. The sheet is dried and then a 1:10 enlargement of a microfilm negative is projected on to the layer side thereof by means of a conventional optical system. The light-source used is a high pressure mercury vapor lamp of the type HBO500W sold by Osram; the exposure time is 1 to 2 minutes.

Then, the entire layer is dyed with Carbon Black FW2. When the sheet is now cautiously sprayed with water, a deep black positive enlargement of the microfilm is produced.

EXAMPLE 11

A clear cellulose acetate film is coated with a 0.8 percent benzene solution of a copolymer prepared from 19.5 parts by weight of ethylene oxide and 0.5 part by weight of a chalkone of the following formula

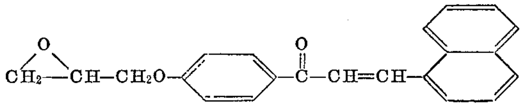

After image-wise exposure under a negative original (15 seconds; 40 amp. carbon arc lamp at a distance of 1 m.), the entire layer is dyed with a pigment, e.g. Carbon Black FW2. By cautiously spraying with water, the pigment is then removed from the areas of the layer not struck by light. A positive copy of the original is thus obtained.

Copies may be prepared in the same manner, using electrolytically roughened aluminum as the supporting material.

EXAMPLE 12

An electrolytically roughened aluminum foil is coated with a 2.1 percent dioxane solution of a copolymer, prepared as described in Example 1, from 95 parts by weight of ethylene oxide and 6.7 parts by weight of a 4-glycidoxy-cinnamic acid amide of the following formula:

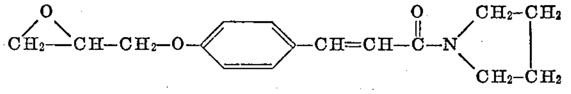

to which 2.5 percent, based on the solid content of the solution, of Michler's ketone have been added. The foil is exposed for 1 to 3 minutes under a negative original, using the illumination device described in Example 2.

The latent image thus produced is made visible by the method described (sub a) in Example 5.

EXAMPLES 13 TO 16

Electrolytically roughened aluminum foils are coated on a plate whirler with the following solutions:

*Example 13.*—A 1.1 percent benzene solution (with 0.5 percent of glacial acetic acid added) of a copolymer prepared from 99 parts by weight of ethylene oxide and 1 part by weight of a chalkone of the following formula:

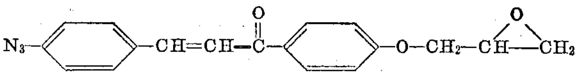

*Example 14.*—A 4 percent benzene solution of a copolymer prepared from 95 parts by weight of ethylene oxide and 5 parts by weight of a chalkone of the following formula:

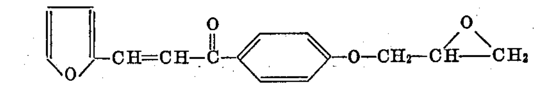

*Example 15.*—A 4 percent benzene solution of a copolymer prepared from 95 parts by weight of ethylene oxide and 5 parts by weight of a chalkone of the following formula:

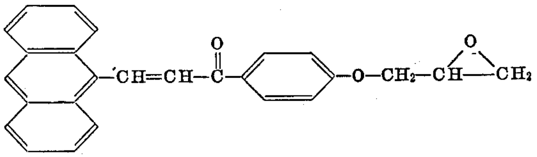

*Example 16.*—A 4 percent benzene solution of a copolymer prepared from 95 parts by weight of ethylene oxide and 5 parts by weight of a chalkone vinylogen of the following formula:

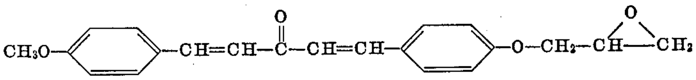

Copies of good marginal definition are obtained by the method described (sub a) in Example 5, by image-wise exposing the various layers under a transparent, negative line original in the following manners:

Example 13: for 1 to 2 seconds with a 40 amp. carbon arc lamp at a distance of 1 m.
Example 14: for 10 to 20 seconds with a 40 amp. carbon arc lamp at a distance of 1 m.
Example 15: for 2 minutes under the illumination device described in Example 2 above.
Example 16: for 3 minutes under the illumination device described in Example 2 above.

The copolymers were prepared analogously to the method described in Example 1 above.

EXAMPLE 17

This example shows that the light-sensitive layer need contain only a very small quantity of the light-sensitive polymer of the invention.

90 parts by weight of ethylene oxide and 10 parts by weight of the glycidoxychalkone used in Example 3 above are polymerized together in toluene according to the process described in Example 1 above. After completion of the reaction of the monomers applied, the toluene solution contains 6 percent of copolymer. To a portion of this solution, polyethylene oxide (molecular weight 600,000) and benzene area added in quantities such that a solution is obtained which contains 5 percent of polymers and that 2 percent of the polymers contained in the solution are the light-sensitive copolymer and 98 percent thereof polyethylene oxide.

An aluminum foil having an electrolytically roughened surface is coated with this solution and dried. A layer of 0.22 mg./cm.$^2$ is left on the coated aluminum surface.

The light-sensitive foil thus obtained is exposed for 5 minutes under a line negative under the conditions described in Example 1 above. The exposed layer then is dyed with Paratoner B and subsequently sprayed with water until the pigment is rinsed away in the areas not struck by light. A red positive copy is obtained on the foil.

It will be obvious to those skilled in the art that many modifications may be made within the scope of the present invention without departing from the spirit thereof, and the invention includes all such modifications.

What is claimed is:

1. A supported light-sensitive reproduction layer which comprises at least one copolymer prepared from at least one epoxide of each of the following types I and II:

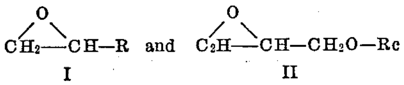

I and II in which R is selected from the group consisting of hydrogen, alkyl, aryl, haolgen alkyl, alkoxy methyl, allyloxy methyl, vinyloxy methyl, and aryloxy methyl; and Rc is selected from the group consisting of $$-Rv-(CH{=}CH)_n-\overset{O}{\overset{\|}{C}}-Rw$$

$$-Rv-\underset{O}{\underset{\|}{C}}-(CH{=}CH)_n-Rx$$

$$-Rv-(CH{=}CH)_n-\overset{O}{\overset{\|}{C}}-(CH{=}CH)_m-Rw$$

$$-\overset{O}{\overset{\|}{C}}-CH{=}CH-Rv,\ \text{and}$$

$$-Rv-CH{=}CH-\overset{O}{\overset{\|}{C}}-Ry$$

in which Rv and Rw each are carbocyclic aromatic groups which are directly linked, via carbon atoms of their aromatic nuclei, to one of the group —CH=CH— and $$-\overset{O}{\overset{\|}{C}}-$$

Rx is selected from the group consisting of a carbocyclic and a heterocyclic aromatic group which is directly linked, via a carbon atom of its aromatic nucleus to one of the groups —CH=CH—; Ry is selected from the group consisting of an alkyl ester group, an aryl ester group, a dialkyl amide group and a heterocyclic amide group; and *n* and *m* are whole numbers from 1 to 4.

2. A reproduction layer according to claim 1 including at least one material selected from the group consisting of a dyestuff, a pigment, and a filler.

3. A reproduction layer according to claim 1 in which component II is present in the copolymer in a quantity in the range of about 0.01 to 10 mole percent, calculated on the quantity of the copolymer.

4. A reproduction layer according to claim 1 in which the copolymer contains at least 50 percent by weight, based on the weight of the copolymer, of ethylene oxide, incorporated as component I by polymerization.

5. A photographic reproduction process which comprises exposing a supported light-sensitive layer to light under a master and developing the resulting image by treatment with a solvent, the layer comprising at least one copolymer prepared from at least one epoxide of each of the following types I and II

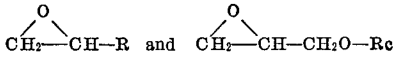

I and II in which R is selected from the group consisting of hydrogen, alkyl, aryl, halogen, alkyl, alkoxy methyl, allyloxy methyl, vinyloxy methyl and aryloxy methyl; and Rc is selected from the group consisting of $$-Rv-(CH{=}CH)_n-\overset{O}{\overset{\|}{C}}-Rw$$

$$-Rv-\underset{O}{\underset{\|}{C}}-(CH{=}CH)_n-Rx$$

$$-Rv-(CH=CH)_n-\overset{\overset{\displaystyle O}{\|}}{C}-(CH=CH)_m-Rw$$

$$-\overset{\overset{\displaystyle O}{\|}}{C}-CH=CH-Rv$$

and $$-Rv-CH=CH-\overset{\overset{\displaystyle O}{\|}}{C}-Ry$$

in which Rv and Rw each are carbocyclic aromatic groups which are directly linked, via carbon atoms of their aromatic nuclei, to one of the groups —CH=CH— and $$-\overset{\overset{\displaystyle C}{\|}}{O}-$$

Rx is selected from the group consisting of a carbocyclic and a heterocyclic aromatic group which is directly linked, via a carbon atom of its aromatic nucleus to one of the groups —CH=CH—; Ry is selected from the group consisting of an alkyl ester group, an aryl ester group, a dialkyl amide group and a heterocyclic amide group; and *n* and *m* are whole numbers from 1 to 4.

6. A photographic reproduction process according to claim 5 in which the layer includes at least one material selected from the group consisting of a dyestuff, a pigment, and a filler.

7. A photographic reproduction process according to claim 5 in which the exposed light-sensitive layer is colored before development with a material selected from the group consisting of a pigment and a dyestuff.

8. A photographic reproduction process according to claim 5 in which component II is present in the copolymer in a quantity in the range of about 0.01 to 10 mole percent, calculated on the quantity of the copolymer.

9. A photographic reproduction process according to claim 5 in which the copolymer contains at least 50 percent by weight, based on the weight of the copolymer, of ethylene oxide, incorporated as component I by polymerization.

10. A photographic reproduction process according to claim 5 in which the solvent is selected from the group consisting of organic solvents, water, and mixtures thereof.

References Cited

UNITED STATES PATENTS 3,410,824 11/1968 Atkinson ------------ 96—115

NORMAN G. TORCHIN, Primary Examiner

R. H. SMITH, Assistant Examiner

U.S. Cl. X.R.

96—115, 33